United States Patent
Zhu et al.

(10) Patent No.: US 7,776,725 B2
(45) Date of Patent: Aug. 17, 2010

(54) ANTI-HALO COMPENSATION

(75) Inventors: Huilong Zhu, Poughkeepsie, NY (US);
Philip Oldiges, Lagrangeville, NY (US);
Cheruvu S. Murthy, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 918 days.

(21) Appl. No.: 11/162,478

(22) Filed: Sep. 12, 2005

(65) Prior Publication Data
US 2007/0054480 A1 Mar. 8, 2007

(51) Int. Cl.
*H01L 21/04* (2006.01)
(52) U.S. Cl. .............. 438/510; 438/197; 438/199; 257/E21.336; 257/E21.345; 257/E21.423; 257/E21.633
(58) Field of Classification Search .............. 438/197, 438/199, 510; 257/E21.336, 345, 423, 633
See application file for complete search history.

(56) References Cited

U.S. PATENT DOCUMENTS

| | | | | |
|---|---|---|---|---|
| 5,395,773 A | * | 3/1995 | Ravindhran et al. | 438/217 |
| 5,759,901 A | * | 6/1998 | Loh et al. | 438/305 |
| 5,834,347 A | * | 11/1998 | Fukatsu et al. | 438/232 |
| 5,917,219 A | * | 6/1999 | Nandakumar et al. | 257/348 |
| 5,926,712 A | * | 7/1999 | Chen et al. | 438/291 |
| 6,037,230 A | * | 3/2000 | Holloway | 438/289 |
| 6,174,778 B1 | * | 1/2001 | Chen et al. | 438/302 |
| 6,228,725 B1 | * | 5/2001 | Nandakumar et al. | 438/289 |
| 6,271,565 B1 | * | 8/2001 | Hook et al. | 257/344 |
| 6,387,766 B1 | * | 5/2002 | Schumann | 438/303 |
| 6,417,547 B2 | * | 7/2002 | Kang | 257/369 |
| 6,420,761 B1 | * | 7/2002 | Gauthier et al. | 257/360 |
| 6,452,236 B1 | * | 9/2002 | Nadakumar et al. | 257/356 |
| 6,465,315 B1 | * | 10/2002 | Yu | 438/306 |
| 6,548,842 B1 | * | 4/2003 | Bulucea et al. | 257/288 |
| 6,562,713 B1 | | 5/2003 | Belyansky et al. | |
| 6,563,176 B2 | * | 5/2003 | Gauthier et al. | 257/360 |
| 6,627,963 B2 | * | 9/2003 | Cochran et al. | 257/392 |
| 6,657,244 B1 | | 12/2003 | Dokumaci et al. | |
| 6,686,637 B1 | | 2/2004 | Dokumaci et al. | |
| 6,709,926 B2 | | 3/2004 | Chidambarrao et al. | |
| 6,770,944 B2 | * | 8/2004 | Nishinohara et al. | 257/402 |
| 6,780,694 B2 | | 8/2004 | Doris et al. | |
| 6,806,534 B2 | | 10/2004 | Dokumaci et al. | |

(Continued)

OTHER PUBLICATIONS

U.S. Appl. No. 10/908,442, entitled "Anti Halo Compensation".

*Primary Examiner*—Thao X Le
*Assistant Examiner*—Eric W Jones
(74) *Attorney, Agent, or Firm*—Joseph P. Abate; Roberts Mlotkowski Safran & Cole, P.C.

(57) ABSTRACT

An apparatus and method for controlling the net doping in the active region of a semiconductor device in accordance with a gate length. The method includes doping a short channel device and a long channel device with a first dopant, and doping the short channel device and the long channel device with a second dopant at a same implantation energy, dose, and angle for both the short channel device and the long channel device. The second dopant neutralizes the first dopant in portion to a gate length of the short channel device and the second channel device.

16 Claims, 10 Drawing Sheets

U.S. PATENT DOCUMENTS

| | | | |
|---|---|---|---|
| 6,822,297 B2 * | 11/2004 | Nandakumar et al. | 257/356 |
| 6,891,235 B1 * | 5/2005 | Furukawa et al. | 257/408 |
| 6,940,137 B2 * | 9/2005 | Chen et al. | 257/408 |
| 7,151,292 B1 * | 12/2006 | Wong | 257/314 |
| 2002/0056882 A1 * | 5/2002 | Gauthier et al. | 257/379 |
| 2002/0093064 A1 * | 7/2002 | Inaba | 257/408 |
| 2002/0182757 A1 * | 12/2002 | Conchieri et al. | 438/7 |
| 2003/0013242 A1 * | 1/2003 | Lai et al. | 438/197 |
| 2003/0122164 A1 * | 7/2003 | Komatsu | 257/219 |
| 2004/0033665 A1 * | 2/2004 | Wann | 438/291 |
| 2004/0110351 A1 * | 6/2004 | Narasimha | 438/302 |
| 2006/0255375 A1 * | 11/2006 | Dokumaci et al. | 257/270 |

* cited by examiner nFet Vt vs. Gate Length

ANTI-HALO COMPENSATION

FIELD OF THE INVENTION

The invention relates to doping of a semiconductor device, and more particularly to controlling dopant concentration of a semiconductor device in accordance with gate length.

BACKGROUND DESCRIPTION

Doping concentration of the active region of a semiconductor device affects many performance characteristics of the semiconductor device. Additionally, the gate length of the active region of a semiconductor device also affects many characteristics of the semiconductor device. For example, for a given doping concentration, as the gate length of the semiconductor device becomes smaller, the semiconductor device becomes more susceptible to short channel effects, e.g., punch through and high leakage current. Accordingly, under certain circumstances, a semiconductor device which experiences punch through will tend to conduct regardless of the voltage applied to the gate. Such a device will also tend to have a high leakage current and will have high off-state power.

One method to reduce short channel effects as gate length decreases includes increasing the doping concentration in the active region of the semiconductor device. Accordingly, semiconductor devices with shorter gate lengths benefit from having a higher doping concentration between the source and the drain thereby mitigating short channel effects. However, higher doping concentration in the active regions of a semiconductor device increases the semiconductor device's threshold voltage. Thus, as a given semiconductor device's doping concentration in the active region is increased to mitigate short channel effects, there is a corresponding increase in the threshold voltage of the semiconductor device. This, in turn, reduces the drive current of the semiconductor device and reduces the performance of the chip.

Devices with longer gate lengths suffer less from short channel effects than devices with shorter gate lengths, and longer gate devices do not need to have as high doping concentrations in the active region as shorter gate devices. Devices with a long gate channel preferably have a lower doping concentration in the active region relative to the preferred doping concentration in the active region of a short gate device because higher doping concentrations reduce the drive current of a device. Accordingly, devices having short gate lengths benefit from having higher doping concentrations in the active region, and devices with longer gate lengths benefit from having lower doping concentrations in the active region.

Because of process variations, a semiconductor chip or wafer will have multiple semiconductor devices having various gate lengths. To optimize single to noise ratio, it is preferable to have small changes of threshold voltages in a range of gate lengths or to have uniform distribution of threshold voltages across gate lengths. In order to maximize the performance/power ratio of the total chip, it is also preferable to maximize the ratio of doping concentration in the short channel devices to doping concentration in the long channel devices for a given difference of the gate lengths between the short channel devices and the long channel devices. Accordingly, the leakage current and off-state power of the short channel devices will be reduced and the drive current and performance of the long channel devices will be increased, thereby increasing the performance of the chip for a given power.

The channel of a semiconductor device can be doped with two different types of dopants, i.e., an acceptor type dopant ($N_A$) or a donor type dopant ($N_D$). For an NFET, net doping concentration in the channel is defined as the acceptor type dopant concentration minus the donor type dopant concentration, i.e., $N_A-N_D$; whereas for a PFET, it is defined by $N_D-N_A$. For an NFET, the net doping concentration in the channel should be acceptor type ($N_A>N_D$) to obtain right threshold voltage, while for a PFET, the reverse is true.

In order to maximize the performance/power ratio of a chip, the net doping concentration in the channel should be as high as possible in short channel devices and as low as possible in long channel devices for a given difference of the gate lengths between the short channel devices and the long channel devices. For an NFET, one way to achieve this is by making $N_A$ high in short channel devices and low in long channel devices. This can be achieved via a halo implant which is well known in the art. To obtain the net doping concentration in the channel as high as possible in short channel devices and as low as possible in long channel devices for a small difference, say 5-10 nm, of the gate lengths between the short channel devices and the long channel devices, it requires very sharp final halo profile in devices. However, it is difficult to obtain sharp halo profile due to the limitation of ion implantation and/or dopant activation anneal.

SUMMARY OF THE INVENTION

In a first aspect of the invention, a method of manufacturing a device includes doping a short channel device and a long channel device with a first dopant, and doping the short channel device and the long channel device with a second dopant at a same implantation energy, dose, and tilt angle. The second dopant neutralizes the first dopant more in a substantial portion of the active region of the long channel device than that of the short channel device.

In another aspect of the invention, the method of doping a semiconductor comprises doping a first device and a second device with a first dopant, and neutralizing a portion of the dopant with a second, inverse, dopant under a gate of the second device. The second, inverse, dopant is implanted at a same implantation energy, dose, and angle for both the first device and the second device. The first dopant comprises, for an nFET type device, B, In or $BF_2$, and for a pFET type device, P, As or Sb, and the second, inverse, dopant comprises, for a pFET type device, B, In or $BF_2$, and for an nFET type device, P, As or Sb.

In another aspect of the invention, a semiconductor device includes a first device having a first channel length and a second device having a second channel length. The net dopant under the second channel has a concentration lower than the dopant under the first channel, which is substantially proportional to a respective channel length.

DETAILED DESCRIPTION OF EMBODIMENTS OF THE INVENTION

In general, embodiments of the invention include a method and structure where an active region of a semiconductor device receives a halo dopant and also receives an inverse halo dopant. In the method and structure of the invention, the concentration of the inverse halo dopant is in proportion to gate length (i.e., a longer gate absorbs more dopant and a shorter gate absorbs less dopant). Together, the halo dopant plus the inverse halo dopant result in a larger difference in net doping between a short channel device and long channel device than the halo doping would achieve, alone. Thus, embodiments of the invention create dopant regions in the channel of FETs such that the amount of net dopant concentration decreases when the gate length decreases. This, in turn, increases the effective amount of net halo doping in short channel devices more than possible with standard halo implant methods or creates sharper net halo doping profile than that with standard halo implant methods.

Figure 1:
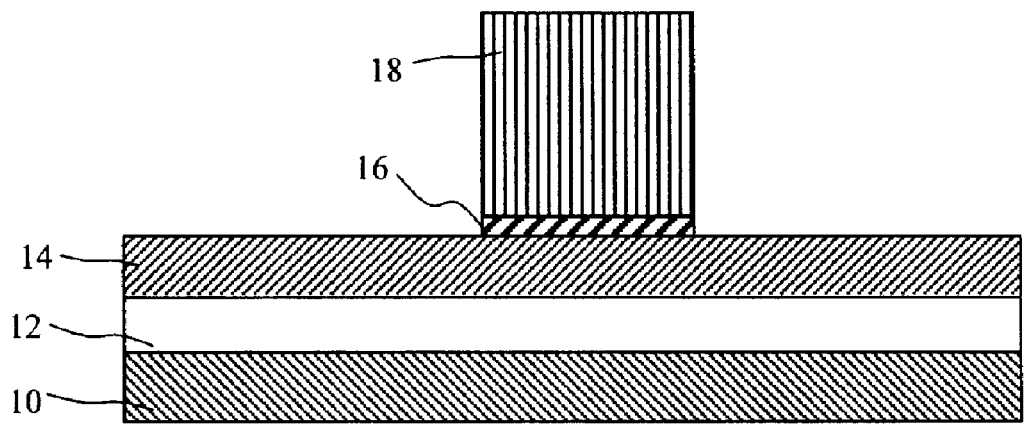
FIGS. 1-5b are cross-sectional views of an embodiment of a method of making a device in accordance with the invention.

Referring to FIG. 1, an example of a starting structure for an embodiment in accordance with the invention is shown. In FIG. 1, an optional oxide BOX 12 is formed on a substrate 10 and an SOI layer 14 is formed on the optional BOX 12. A gate dielectric 16 is formed on the SOI layer 14. A gate 18 is formed on the gate dielectric 16. As should be understood, the starting structure is formed by any of the suitable methods for forming the respective structures. Thus, the gate dielectric 16 may be formed, for example, from an oxide, a nitride, or high k material, and may include $SiO_2$, for example. The gate 18 may be formed from, for example, a polysilicon or metal gate material. Also, the gate dielectric 16 may be in the range of approximately 0.7 nm to 2 nm, and may also vary from these specifications, depending on the specific applications. The gate 18 may range from about 20 nm to 150 nm in length, for example.

Figure 2:
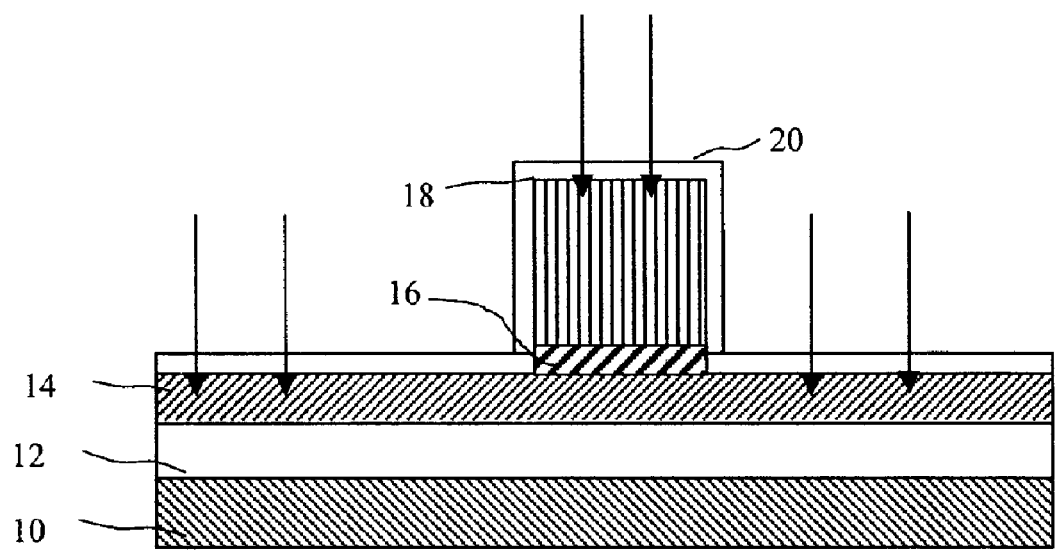

Referring to FIG. 2, an oxidation process is performed to repair and protect the sidewall of the poly gate 18. The oxide, in embodiments, may be grown and then deposited, or only deposited via any well-known deposition processes to form oxide layer 20. The oxide layer 20 may be in the range of, for example, 2 nm to 20 nm, although other ranges are also contemplated for use with the invention.

FIG. 2 further represents an extension implantation process for the device. In this process, a donor element such as, for example, phosphorous (P), arsenic (As), antimony (Sb), etc. is used for a nMOSFET and an acceptor element such as, for example, boron (B), indium (In), boron fluoride ($BF_2$), etc. is used for a pMOSFET. In one implementation, doping occurs at a common energy level and dosage, depending on a particular application. Typical dopant doses for the extension region range from $5 \times 10^{14}$ $cm^{-2}$ to $3 \times 10^{15}$ $cm^{-2}$. Typical dopant energy levels for the extension regions range from 0.1 keV to 10 keV, as illustrative examples.

Figure 3:
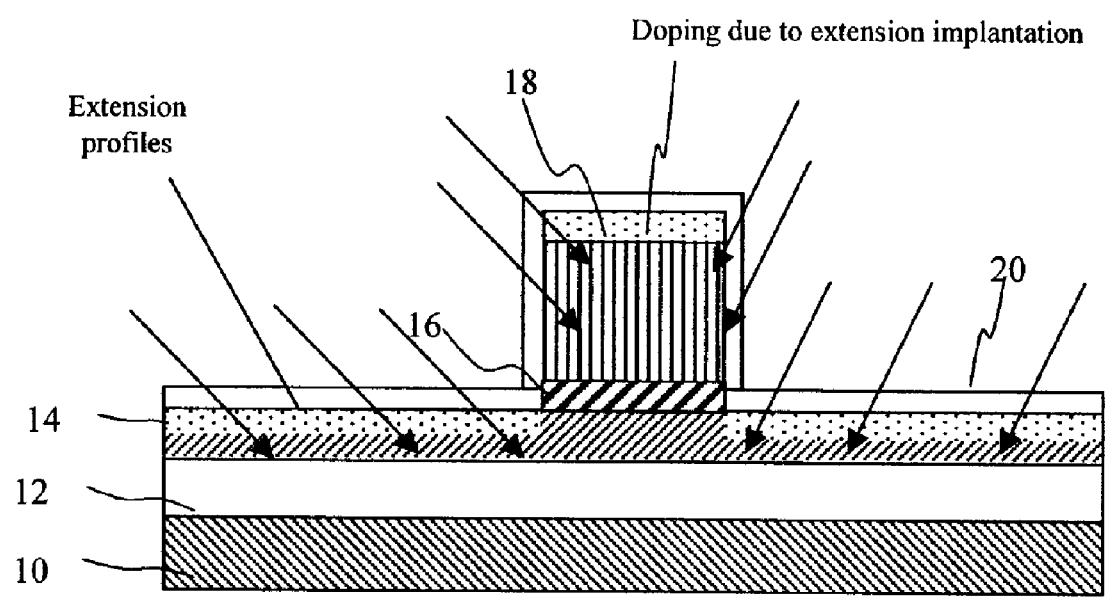

FIG. 3 shows the doping and extension profiles. In one embodiment, the ions, due to the extension implantation of FIG. 2, penetrates the gate 18 to about 5 nm to 15 nm. The doping, due to the extension implantation of FIG. 2, provides a profile of about 180 Å to 400 Å in the SOI layer 14 after dopant activation anneal. It should be understood by those of skill in the art that the profile in the SOI layer 14, as well as the profile in the gate 18 are one non-limiting illustrative example, and thus may vary depending on the particular energy level and dopant concentration for a specific application.

FIG. 3 also represents an angled halo implantation process. The halo implantation doping process is performed at an angle of approximately 30°, although other angles are also contemplated for use by the invention. The halo regions may be formed by any of the standard halo implantation methods appropriate for the type of device being formed. For example, for an nFET type device, the halo regions may be formed from, for example, B, In, $BF_2$, etc. with doses ranging from $1 \times 10^{13}$ $cm^{-2}$ to $2 \times 10^{14}$ $cm^{-2}$, dopant energies ranging from 1 keV to 100 keV and tilt angle ranging from 10° to 50°. For a pFET type device, the halo regions may be formed from, for example, P, As, Sb, etc. In implementation, the type of dopant used to form the halo regions of FIG. 3 will be opposite of the type of dopants used in the processing steps of FIG. 2.

Figure 4A:
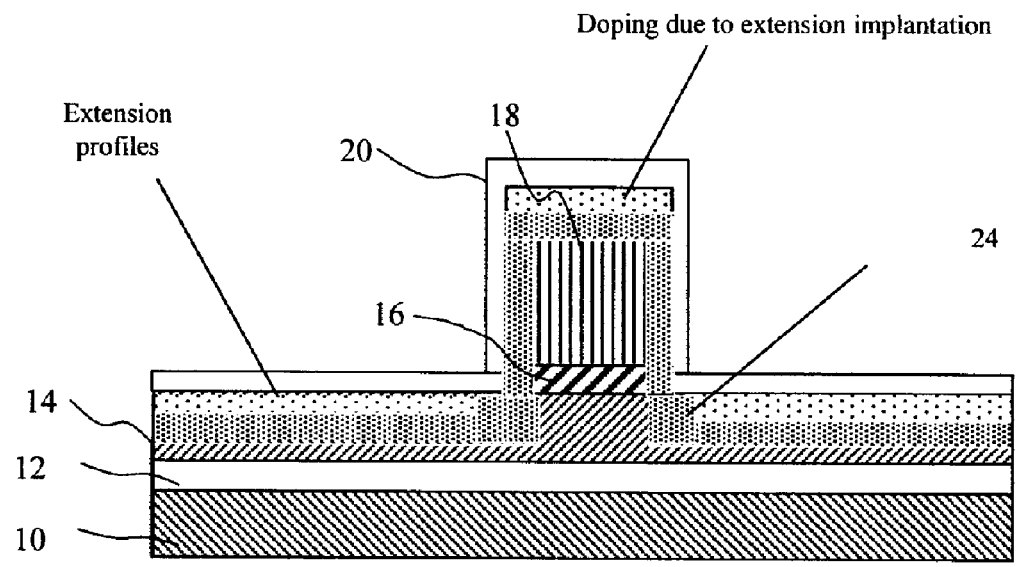
Figure 4B:
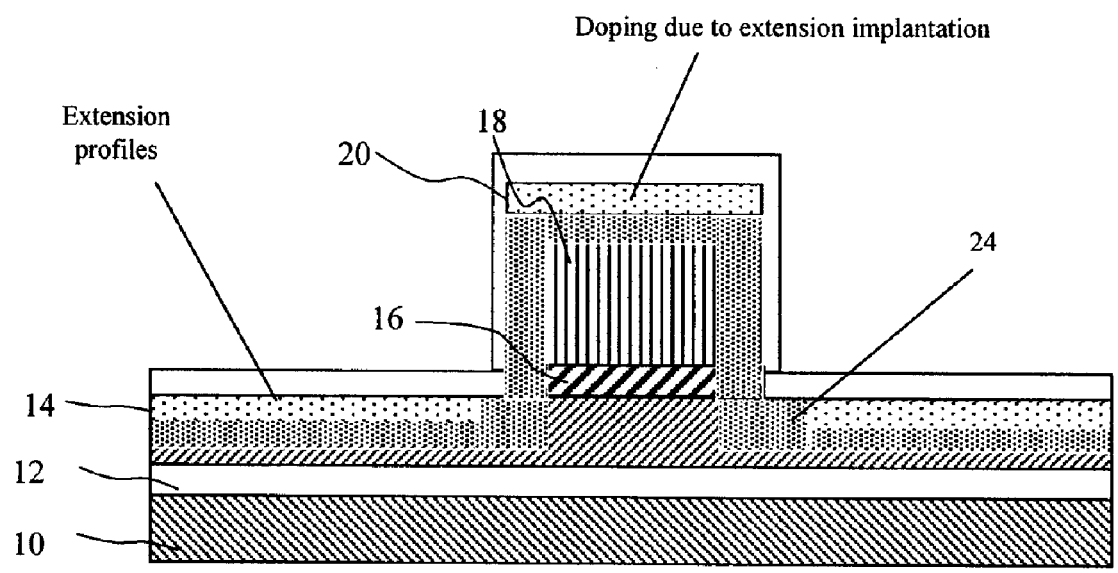

FIGS. 4a and 4b show halo profiles 24 for both a short channel device and a long channel device, respectively, using the processes of FIG. 3. The halo profiles, in one embodiment, are in the range of 10 nm to 50 nm.

Figure 5A:
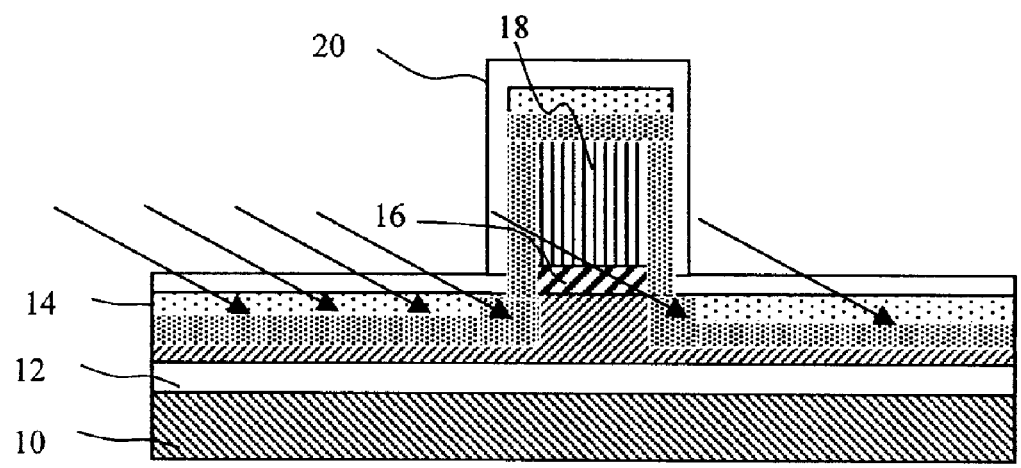
Figure 5B:
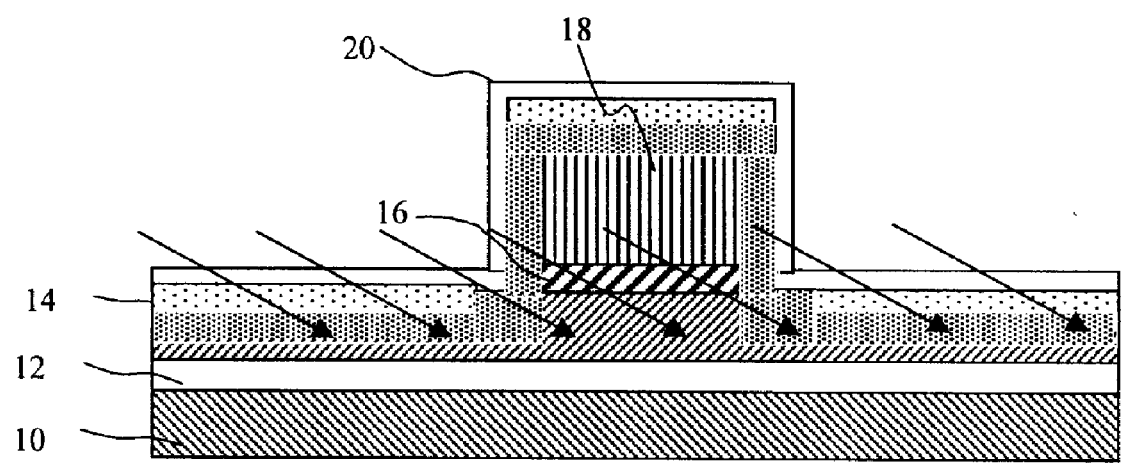

FIGS. 5a and 5b represent an inverse halo implantation process for both a short channel device and a long channel device, respectively. In this process, the implantation includes, for example, doping the device with a donor element, e.g., P, As, Sb, etc. for the nMOSFET device, and an acceptor element, e.g., B, In, $BF_2$, etc. for the pMOSFET device. Thus, the type of dopant used in the inverse halo implantation process, in accordance with the invention, will be opposite of the type of dopants used for the initial halo implantation shown in FIG. 3.

Figure 7:
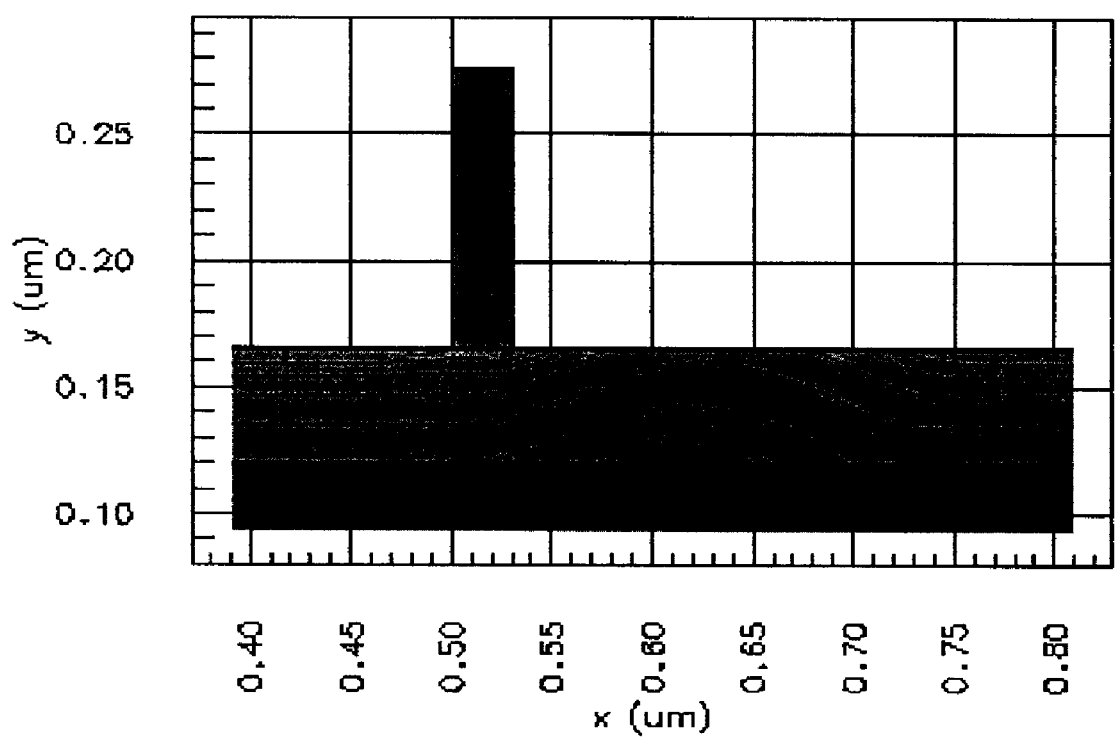
FIG. 7 is a simulated contour graph for a 30 nm gate length device in accordance with the invention.
Figure 8:
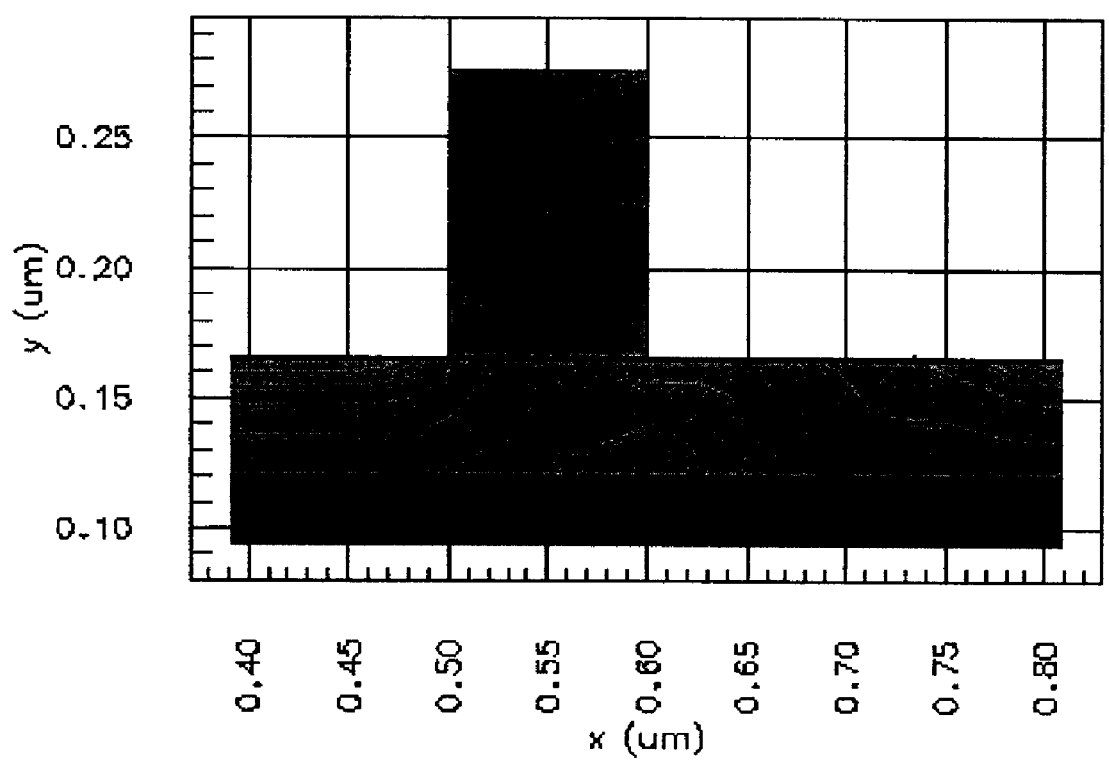
FIG. 8 is a simulated contour graph for a 100 nm gate length device in accordance with the invention.

The inverse halo implantation, in embodiments, comprises the same implantation energy, same dose, and same angle for both the short channel device and the long channel device. In one embodiment, the inverse halo implantation is provided at a title angle of, for example, 45°. This tilt angle, though, will vary depending on many different factors including, for example, implantation energy, dose and length of the gate channel. Accordingly, it is contemplated, in embodiments, that the tilt angle can vary between 10° and 50° or more depending on the channel length of the gate, or other angles depending on the remaining parameters. In one illustrative embodiment, the angle will decrease as the length of the gate decreases with keeping other implantation conditions the same. (Two illustrative examples are shown in FIGS. 7 and 8, discussed in more detail below.) Or the implant energy will decrease as the length of the gate is scaled down with keeping other implantation conditions the same.

In FIGS. 5a and 5b, the implant angle and energy for the inverse halo implantation process are chosen so that most of the dopant passes through and does not affect the channel of a shorter channel length; whereas, sufficient dopant remains in the channel of a longer gate device. In this manner, the dopant being implanted into the active region of the longer gate length will neutralize a portion of the halo dopant.

Thus, in accordance with the invention, in the inverse halo implantation, the ions can reach from one side of the short gate to a place where it is close to the halo region under the corner around another side of the short gate. In this case, as shown, the shorter the channel length, the less dose is received within the channel, itself. In this way, the inverse halo implantation process of the invention reduces threshold voltage in absolute value more for the long channel devices than that for short channel device, since an opposite dopant is used in the inverse halo implantation.

Typical inverse dopant doses range from about $1 \times 10^{13}$ $cm^{-2}$ to about $2 \times 10^{14}$ $cm^{-2}$. The inverse halo implant can be also be performed at relatively high energy such as, for example, 200 keV for As. Additionally, in device manufacturing quadrille implantation is used; namely, implantation is performed with rotation angles of the wafer at 0, 90, 180, and 270 degrees for the short channel device and the long channel device, for symmetry devices or two way implantation with rotation angles of the wafer at 0 and 180 degrees. For devices with asymmetry halo profiles, asymmetry halo implant can be used.

Figure 6A:
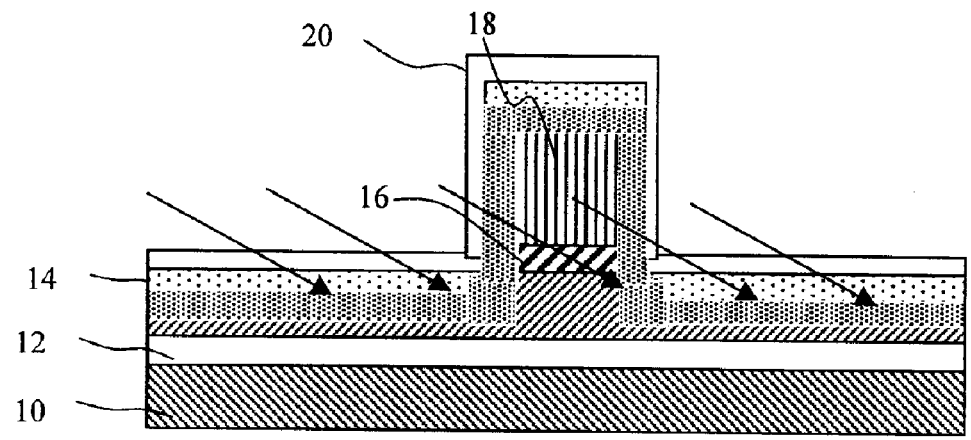
FIGS. 6a and 6b show an optional step for both a short channel device and a long channel device, respectively, in accordance with the invention.
Figure 6B:
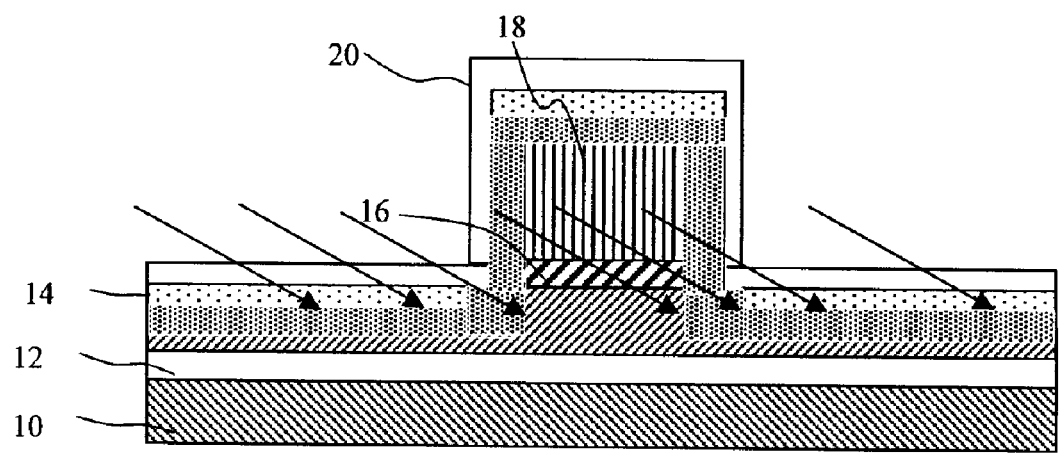

FIGS. 6a and 6b show an optional step for both a short channel device and a long channel device, respectively. In this embodiment, to avoid the voltage threshold (Vt) from being too low for long channel devices, another angle implantation or inverse halo implantation can be performed. This is used to compensate the inverse halo conducted in FIG. 5 and focuses on the values of Vt for long channel devices. The type of the species for this angle implantation is the same as the initial halo implantation, e.g., the nMOSFET device will be doped with boron, $BF_2$ or indium, etc. and the pMOSFET device will be doped with arsenic, antimony or phosphorus, etc. In this embodiment, it is possible to achieve better short channel effect as well as reasonable threshold voltage for the long channel device or better uniformity of Vt distribution crossing a large range of device gate lengths.

As should now be understood, in view of the above description, where the energy is sufficiently high and using an implant angle (such as, for example, 45°), a significant portion of the dopants of the compensating implant will pass through and out of the active region for short channel lengths. For longer channel lengths, more of the compensating implant will be absorbed or stay in the channel. Therefore, a doping region is created where the dopant concentration of the implant increases as the channel length increases. This is the reverse of a halo implant where the concentration averaged over channel length traditionally increases as the channel length decreases.

With the inverse dopant concentration increasing at longer channel lengths, it is possible to achieve a larger delta in channel concentration between the short and long channel than with a traditional halo only implant. ("Delta" is the difference in dopant concentration averaged over a channel length as a function of channel length between multiple devices on a semiconductor chip.) By increasing the delta on a chip, the overall performance of the chip is improved because the doping of the nominal gate length device is minimized while the doping of the shorter gate length device is maximized. In other words, this improves the threshold voltage versus gate length or roll-off more than a traditional halo only implant. Even if the dopant concentration is constant as a function of channel length to begin with (i.e. well doping), a difference in dopant concentration between the longer and shorter channel lengths can be achieved by using this technique.

Normal process steps to finish building devices (including spacer formation, source drain implantation, source/drain annealing, and metalization) can be implemented after the inverse halo implantation step of FIGS. 5a and 5b, or the compensating implantation step of FIGS. 6a and 6b. For example, source/drain spacers are formed on either side of the gate, above the extension regions in the substrate. The source/drain spacers may be formed by any of the standard methods for forming sidewall spacers. Source/drain regions are formed in the substrate to either side of the source/drain spacers. The source/drain region may be formed from any of the dopants appropriate for the type of device being formed. For example, for a nFET device, the source/drain region may be formed from, for example, arsenic or phosphorous. For a pFET type device, the source drain region may be formed from, for example, boron or $BF_2$.

FIG. 7 shows a simulated contour for As concentration for a 30 nm gate length using the inverse halo implantation according to the invention. FIG. 8 shows a simulated contour for As concentration for a 100 nm gate length using the inverse halo implantation according to the invention. In both FIGS. 7 and 8, the inverse halo implantation conditions included: (i) the use of As, (ii) at an energy level of 200 keV, (iii) at a dosage concentration of $1 \times 10^{13}$ $cm^{-2}$ and (iv) a tilt angle of 45°. As shown in these graphs, the dosage concentration under the gate region is greater in the 100 nm gate length device than that of the 30 nm gate length device. As described previously, due to the inverse halo implantation process, as discussed above, the inverse halo dopant concentration under the gate increases significantly as the gate length is increased.

Figure 9:
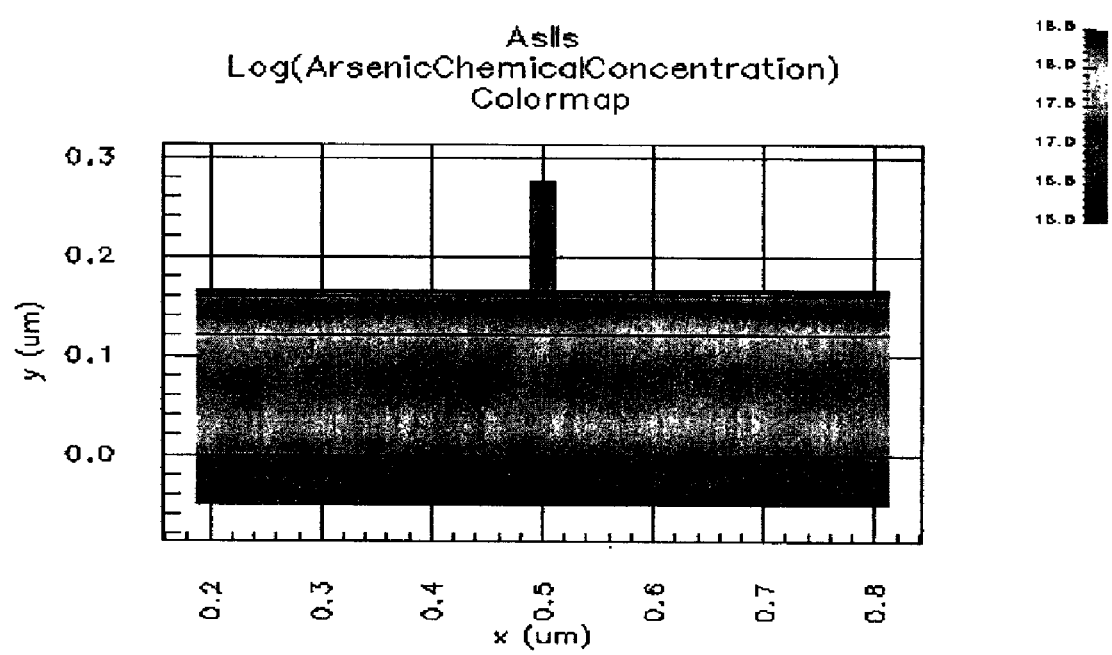
FIG. 9 is a profile graph for a 20 nm gate length device in accordance with the invention.
Figure 10:
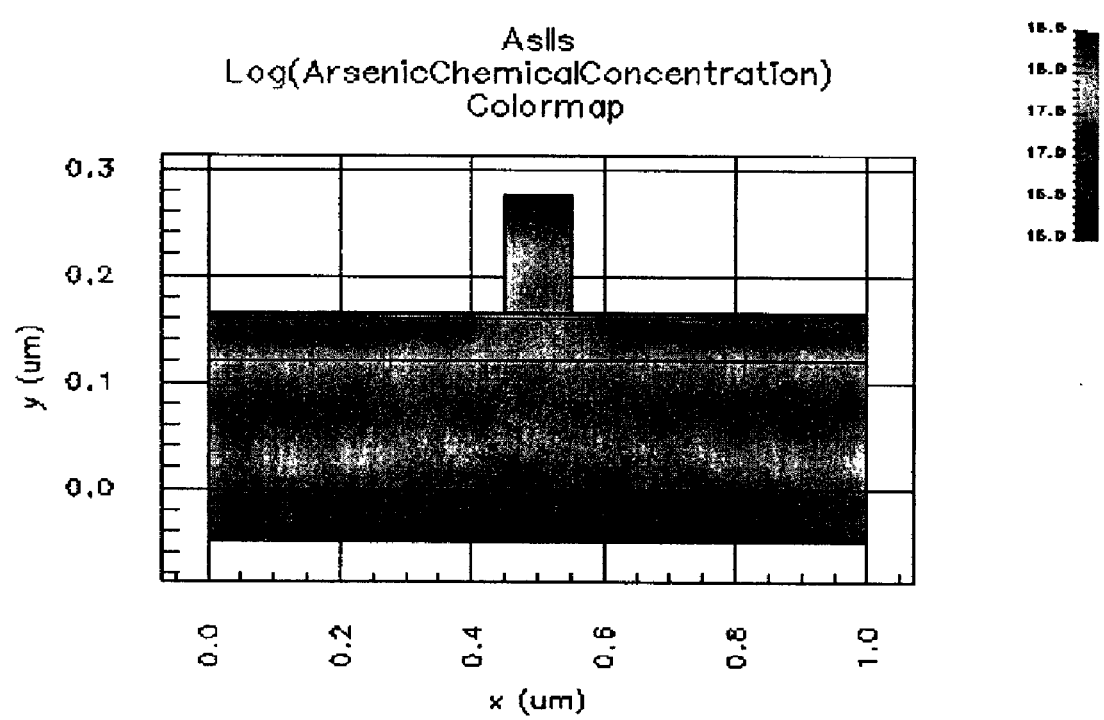
FIG. 10 is a profile graph for a 100 nm gate length device in accordance with the invention.

FIG. 9 shows a profile after quadrille inverse halo implantation for a gate length of 20 nm gate using an As inverse halo implantation according to the invention. FIG. 10 shows a profile after quadrille inverse halo implantation for a gate length of 100 nm gate using an As inverse halo implantation according to the invention. As seen from a comparison of FIGS. 9 and 10, using the inverse halo implantation according to the invention, less arsenic is under the gate in the 20 nm gate length embodiment than that of the 100 nm gate length embodiment. Thus, it is again shown that the inverse halo dosage concentration under the gate region is greater in the longer gate, e.g., 100 nm gate length, than that of the shorter gate, e.g., 20 nm gate length. Said otherwise, As concentration under the short gate device of FIG. 9 is less than the As concentration for the long gate device of FIG. 10 due to the higher absorption rate in the long channel device.

Figure 11:
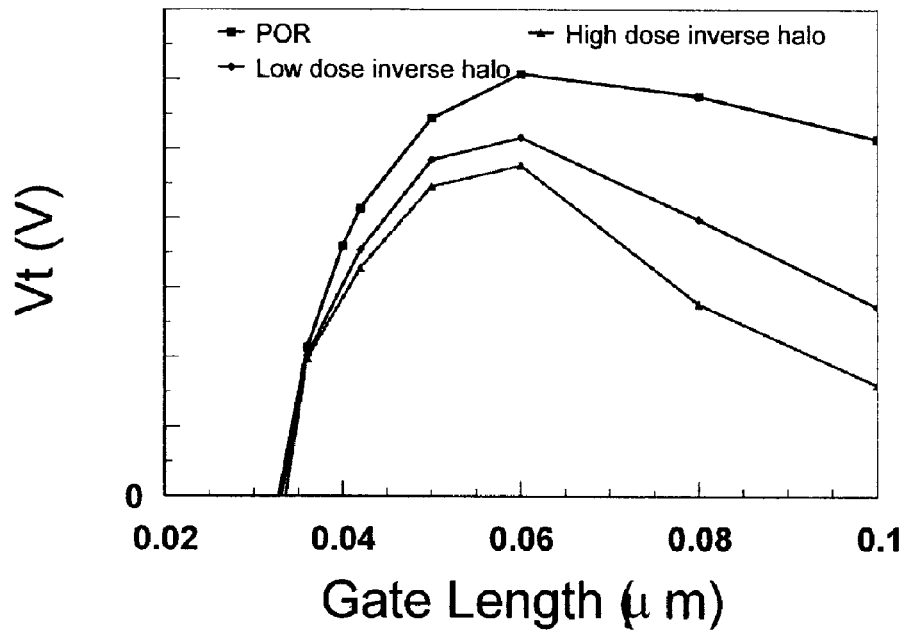
FIG. 11 is a graph of threshold voltage versus gate length in accordance with an embodiment of the invention.

FIG. 11 is a simulated voltage threshold ($Vt_{sat}$) plots for different gate lengths compared to a conventional system. In FIG. 11, POR is the process of record and is a baseline for measuring the beneficial effects of the invention. In accordance with the invention, the modulation of the curve is substantially decreased using the methods of the invention. As shown in the plots, beneficial effects occur between gate lengths of 35 nm and 60 nm, which means that the Vt difference for POR between 35 nm device and 60 nm device is larger than that for the cases with inverse halo implantation.

However, in real manufacturing process the value of Vt is not allowed to change much even for long gate lengths. To flatten the curves from 0.06 to 0.1 μm gate length, for example, to thereby avoid the Vt from being too low in the longer gate lengths, it is possible to perform another angle implantation, as described with reference to FIGS. 6a and 6b. Such an angle implantation process will decrease the modulation in the curve, e.g., flatten the curve in the range of 0.06 to 0.1 μm gate length. It is thus possible to achieve even better short channel effect as well as reasonable threshold voltage for the long channel.

Figure 12:
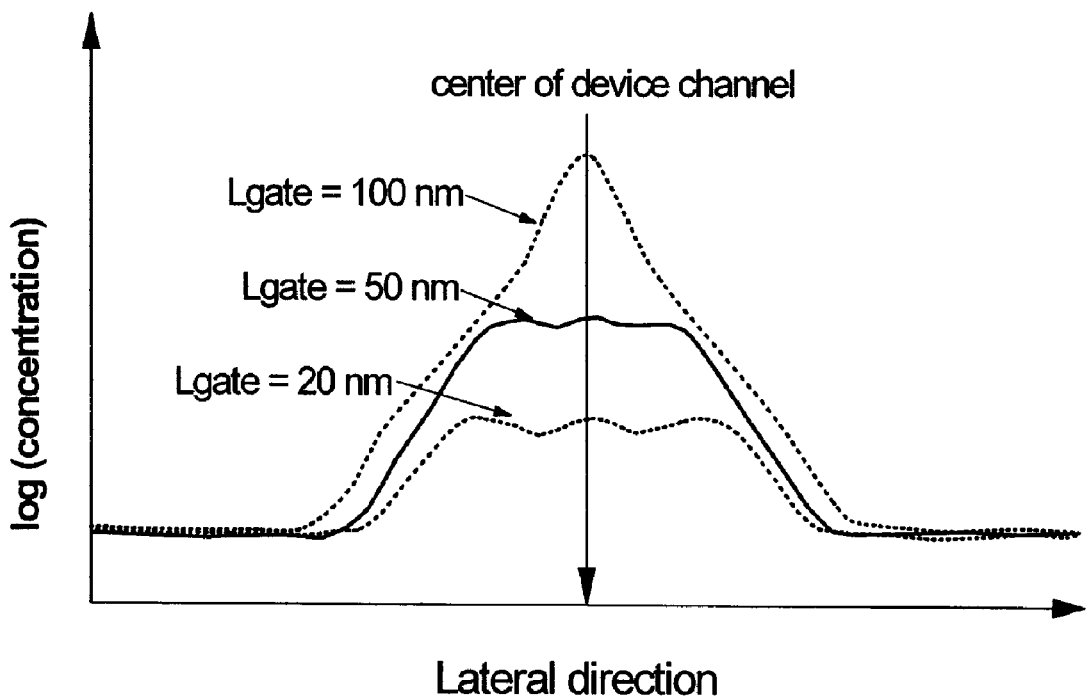
FIG. 12 is a graph showing lateral profiles of different gate lengths in accordance with the invention.

FIG. 12 represents lateral profiles of different gate lengths using the processes of the invention. As shown in FIG. 12, the concentration of dopant in the channel area under gate oxide increases as the gate length become larger. For example, referring to FIG. 12, concentration versus position for gate lengths of 20 nanometers, 50 nanometers and 100 nanometers. As is shown from the graph, the concentration of the inverse halo implant dopant is less overall for shorter gates thereby having less of a compensation effect for the shorter gates. Thus, the implant has a greater effect for the longer length gates. Thus, it is again shown that the dosage concentration under the gate region is greater in the longer gate, e.g., 100 nm gate length, than that of the shorter gates, e.g., 20 nm and 50 nm gate lengths.

Thus, embodiments include a method and device to provide a net doping concentration in an active region of a semiconductor device inversely proportional to gate length. The net doping concentration is tailored to gate length by adding a compensating implant proportional to gate length (longer gate receives more compensating dopant) and electrically neutralizing a portion of the halo or well dopant.

While the invention has been described in terms of exemplary embodiments, those skilled in the art will recognize that the invention can be practiced with modifications and in the spirit and scope of the appended claims.

What is claimed is:

1. A method of manufacturing a device, comprising:
    doping a short channel device and a long channel device with a first type of dopants; and
    doping the short channel device and the long channel device with a second type of dopants, which is opposite to the first type of dopants, the doping of the second type of dopants at a same implantation energy, dose, and angle for both the short channel device and the long channel device,
    wherein the second type of dopants neutralizes the first type of dopants in a substantial portion of a channel region of the long channel device while maintaining a substantial dopant concentration of the first dopant in a channel region of the short channel device.

2. The method of claim 1, wherein each dopant of the first type of dopants is an acceptor element comprising one of boron (B), indium (In), and boron fluoride ($BF_2$), and each dopant of the second type of dopants is a donor element comprising one of phosphorous (P), arsenic (As), and antimony (Sb).

3. The method of claim 1, further comprising doping extension regions of at least the short channel device and the long channel device, wherein: the short channel device and the long channel are at least one of an nMOSFET and a pMOSFET, the pMOSFET is doped by the second type of dopants with at least one of boron (B), indium (In), and boron fluoride ($BF_2$), and the nMOSFET is doped by the second type of dopants with at least one of phosphorous (P), arsenic (As), antimony (Sb).

4. The method of claim 1, wherein doping with the first type of dopants is an angled halo implantation.

5. The method of claim 1, wherein for an nMOSFET device, the angled halo implantation uses one of B, In and $BF_2$, and for a pMOSFET device, the angled halo implantation uses one of P, As, and Sb.

6. The method of claim 5, wherein the doping using a second type of dopants is an inverse halo implantation, comprising: doping the nMOSFET device with at least one of P, As and Sb, and doping the pMOSFET device with at least one of B, In and $BF_2$.

7. The method of claim 5, wherein a type of dopant used in the inverse halo implantation process is opposite of the type of dopant used for the angled halo implantation.

8. The method of claim 1, wherein the angle varies between 10° and 50° or more depending on channel length.

9. The method of claim 1, wherein the angle decreases as the length of each channel decreases.

10. The method of claim 1, wherein: the doping with the second type of dopants is an inverse halo dopant process, the implant angle and energy are chosen so that each dopant of the second type of dopants passes through and does not substantially affect the channel of the short channel device, and each dopant of the second type of dopants remains in the channel of the long channel device to neutralize a portion of the first type of dopants.

11. The method of claim 1, wherein the doping with the second type of dopants is one of a quadrille implantation performed with rotation angles of 0, 90, 180, and 270 degrees for symmetry and rotation angles of 0 and 180 degrees and asymmetry halo implantation for the short channel device and the long channel device.

12. The method of claim 1, further comprising doping the short channel device and the long channel device again with the first type of dopants, at an angle, to stabilize a threshold voltage for the long channel device.

13. A method of doping a semiconductor, comprising
    doping a first device and a second device with a first dopant; and
    neutralizing a portion of the first dopant in a channel region of the second device with a second, inverse, dopant under a gate of the second device, in proportion to a gate length, the second, inverse, dopant being implanted at a same implantation energy, dose, and angle for the first device and the second device,
    wherein the first dopant comprises, for an nFET type device, one of B, In and $BF_2$, and for a pFET type device one of P, As and Sb, and the second dopant comprises, for a pFET type device, one of B, In and $BF_2$, and for an nFET type device one of P, As and Sb.

14. The method of claim 13, further comprising implanting the second, inverse, dopant under a gate substantially proportional to the gate length of the second device.

15. The method of claim 13, further comprising implanting the second, inverse, dopant to allow higher concentration of compensating dopant to be implanted under a gate for the second device, which is longer than a gate for the first device.

16. The method of claim 13, wherein the neutralizing step is an anti halo implantation process performed with rotation angles of a wafer at 0, 90, 180, and 270 degrees for symmetry.

\* \* \* \* \*